US005491360A

United States Patent [19]
Lin

[11] Patent Number: 5,491,360
[45] Date of Patent: Feb. 13, 1996

[54] ELECTRONIC PACKAGE FOR ISOLATED CIRCUITS

[75] Inventor: Peng-Cheng Lin, Cupertino, Calif.

[73] Assignee: National Semiconductor Corporation, Santa Clara, Calif.

[21] Appl. No.: 364,700

[22] Filed: Dec. 28, 1994

[51] Int. Cl.$^6$ .......................... H01L 23/48; H01L 29/44; H01L 29/52; H01L 29/60

[52] U.S. Cl. .......................... 257/672; 257/676; 257/670; 257/725

[58] Field of Search .................................... 257/672, 676, 257/670, 691, 723, 694, 725, 723, 690

[56] References Cited

U.S. PATENT DOCUMENTS

| 4,780,795 | 10/1988 | Meinel | 361/402 |
| 5,313,095 | 5/1994 | Togawa et al. | 257/723 |

FOREIGN PATENT DOCUMENTS

| 2219435 | 12/1989 | United Kingdom | 257/725 |

Primary Examiner—Rolf Hille
Assistant Examiner—Alexander Oscar Williams
Attorney, Agent, or Firm—Hickman & Beyer

[57] ABSTRACT

An electric packaging arrangement for isolated circuits is described. A lead frame is formed with at least one off-centered tie bar connected between one of the circuits on the lead frame's internal lead and an external handling side rail. The tie bar is off-centered by a specified distance from the longitudinal center line of the package. The external side rail is used to support and align the lead frame during manufacturing. To meet safety requirements, such as the UL-1950 requirements, electrical components in a primary circuit and a secondary circuit are attached and electrically coupled to the lead frame in a manner such that the smallest internal distance between internal circuits is at least a predefined distance. The external distance between the tie bar, connected to the secondary circuit, and the closest primary circuit pin is set to meet external circuit component spacing requirements for isolated circuits. The described arrangement has a number of applications including packaging isolated circuits using small form factor packages such as dual-in-line (DIP) and small outline (SO) packages.

18 Claims, 3 Drawing Sheets

ELECTRONIC PACKAGE FOR ISOLATED CIRCUITS

BACKGROUND OF THE INVENTION

This invention relates generally to the formation of packages that contain at least two discrete and isolated circuits.

As the use of multi-chip and hybrid packages increases, there are increased pressures to include two or more isolated circuits in a single package. When one of the circuits is a relatively high voltage circuit such as might be found in high voltage power supplies, amplifier circuits and the like, the isolated circuits must be spaced apart by specified distances both internally and externally to prevent arcing resulting in short circuits thus posing a fire hazard. By way of example, Underwriters Laboratories (UL) has set forth guidelines as to the minimum space between internal isolated circuits and external exposed surfaces for relatively high voltage devices. As is well known to those skilled in the art, there are a number of standard form factors for integrated circuit packages. Thus, even when a package contains two isolated circuits, it is often desirable to package these circuits in standard small form factor packages such as dual in-line (DIP) or small outline (SO) packages. Referring initially to FIG. 1a, a top view of the external portion of a 24-pin SO package for an Isolation Amplifier manufactured by Burr Brown of Tucson, Ariz. is diagrammatically shown. As can be seen, the external pins relating to the primary circuit 4 and secondary circuit 6 are located a distance $d_{ext}$ apart.

There are a number of known processes for packaging integrated circuits. In one standard process, a lead frame 10 is formed from a sheet of conductive material (usually via stamping or etching). A die (or multiple dies or components in the case of multi-chip packages) is then attached and electrically connected to the lead frame. By way of example, bonding wires are often used to form the electrical connections. Thereafter, the die(s), a portion of the lead frame, the electrical connections and any other components are then encapsulated in a package. By way of example, overmolding using a plastic material is common, as are the use of ceramic and other packages. A popular and cost effective way of facilitating handling during these various steps contemplates the integral formation of tie bars and external rails from the conductive sheet. The tie bars connect the lead frame to the external rails. The external rails provide a structure for machinery to grasp and maintain alignment of the lead frame while traveling down a manufacturing assembly line. To obtain a stable attachment to the lead frame, the tie bars must be connected to a solid structure on the lead frame which is typically done by extending the tie bars along the centerline of the lead frame in DIP and SO packages. Following molding of the lead frame and components to form an exterior package, the external rails are trimmed by cutting the tie bar at the edge of the molding and the leads at appropriate places. This leaves the cut-off end of the tie bar exposed through the molding and electrically coupled to one of the internal circuits.

When a pair of isolated circuits are to be encapsulated in a single package, the presence of the tie bar could pose a problem for maintaining a minimum spacing between primary and secondary circuit when one of the circuits requires a number of pins. By way of example, if a conventional width DIP or SO package is used for high voltage isolated circuits, leads for the primary and secondary circuits may not be positioned at opposite sides of the same end if the tie bar is coupled to either circuit since the exposed end of the tie bar would be too close to the opposing circuit for UL approval.

FIG. 1b shows a prior art small form factor package lead frame for isolated circuits having center mounted tie bars 12 and 13. The figure shows the areas punched out of a conductive sheet 10 used for making lead frames. Since the center mounted tie bars 12 and 13 reduce the external spacing between pins, an unconventional scheme is utilized in order satisfy external spacing requirements. In this arrangement, two separate die attach pads 14 and 16 respectively are separated by a gap 18. A primary circuit is positioned on die attach pad 14 and a secondary circuit is positioned on die attach pad 16 where the die attach pads are separated by gap 18 to meet internal spacing requirements. Although this technique allows both internal and external spacing requirements to be met, it is inherently inflexible with respect to pin arrangements. For example, since tie bar 12 is connected to the primary circuit 14, the pins in the proximity of tie bar 12 must be associated with the primary circuit. Similarly, tie bar 13 is connected to the secondary circuit thus the pins in the proximity of tie bar 13 must be associated with the secondary circuit therefore limiting the package to particular pin configurations where a pin of an opposing circuit is not permitted near the tie bar of the other circuit.

Accordingly, an improved method and arrangement for supporting the lead frame during manufacturing of relatively high pin count isolated circuit packages that allow for flexible pin configurations, without jeopardizing UL spacing requirements would be desirable.

SUMMARY OF THE INVENTION

To achieve the foregoing and other objectives and in accordance with purpose of the present invention, a method of packaging electrically isolated circuits and a device comprising such circuits is disclosed. In one embodiment of the invention, the method includes forming a lead frame with at least one tie bar positioned off-center to the longitudinal center of the package. The tie bar is connected at one end of the lead frame off-center i.e. tie bar is connected a specified distance away from the longitudinal center line of the lead frame. An off-center tie bar is a tie bar that, when connected to the secondary circuit, is located a distance of more than half the width of the package from the nearest primary circuit pin. The other end of the tie bar is connected to an external rail used for supporting the lead frame during the manufacturing process. Electronic components including the primary and secondary circuits are affixed and electrically coupled to the lead frame. An encapsulating material is then applied to encapsulate the components and the inner portion of the lead frame to form an exterior protective package. Thereafter, the package is trimmed by cutting off the tie bar at the edge of the molding to remove the external rail. With this arrangement, the tie bar exposed through the molding is offset an additional distance from the primary circuit pins (when the tie bar is connected to the secondary circuit) thereby meeting external space requirements. An offset in the opposite direction may be obtained when the tie bar is instead connected to the primary circuit. The procedure described permits the use of the standard assembly process for small form factor packages such as DIPs and SOs for both through-hole and surface mount applications.

In an apparatus aspect of the invention, a dual in-line type package includes primary and secondary components mounted on and electrically coupled to the leads of a lead frame. An encapsulating material is molded over the circuit components and inner portion of the lead frame forming the package. At least one tie bar is connected off-center to the lead frame via the secondary circuit such that the distance from the tie bar to the nearest primary circuit pin is greater than one half the width of the package. The other end of the tie bar, having been trimmed at the edge of the molding from the manufacturing process, is exposed through the molding thereby qualifying it as an exposed external surface. The difficulty typically is not in meeting minimum internal space requirements but rather that the external space requirement is complicated by the exposed tie bar. The resulting package provides additional space between the tie bar and the closest primary pin thereby qualifying the package for UL approval.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE PREFERRED EMBODIMENTS

Figure 1A:
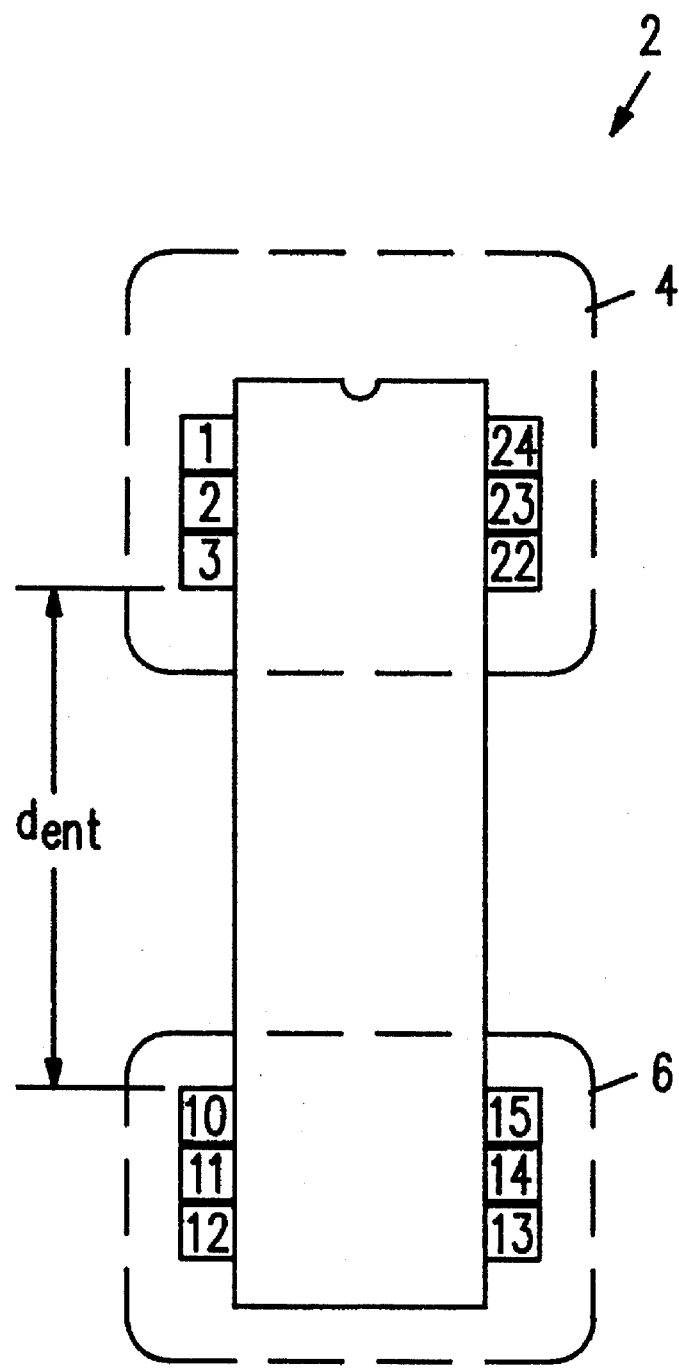
FIG. 1a is a top view of a prior art isolation amplifier external package showing primary and secondary circuit areas.
Figure 1B:
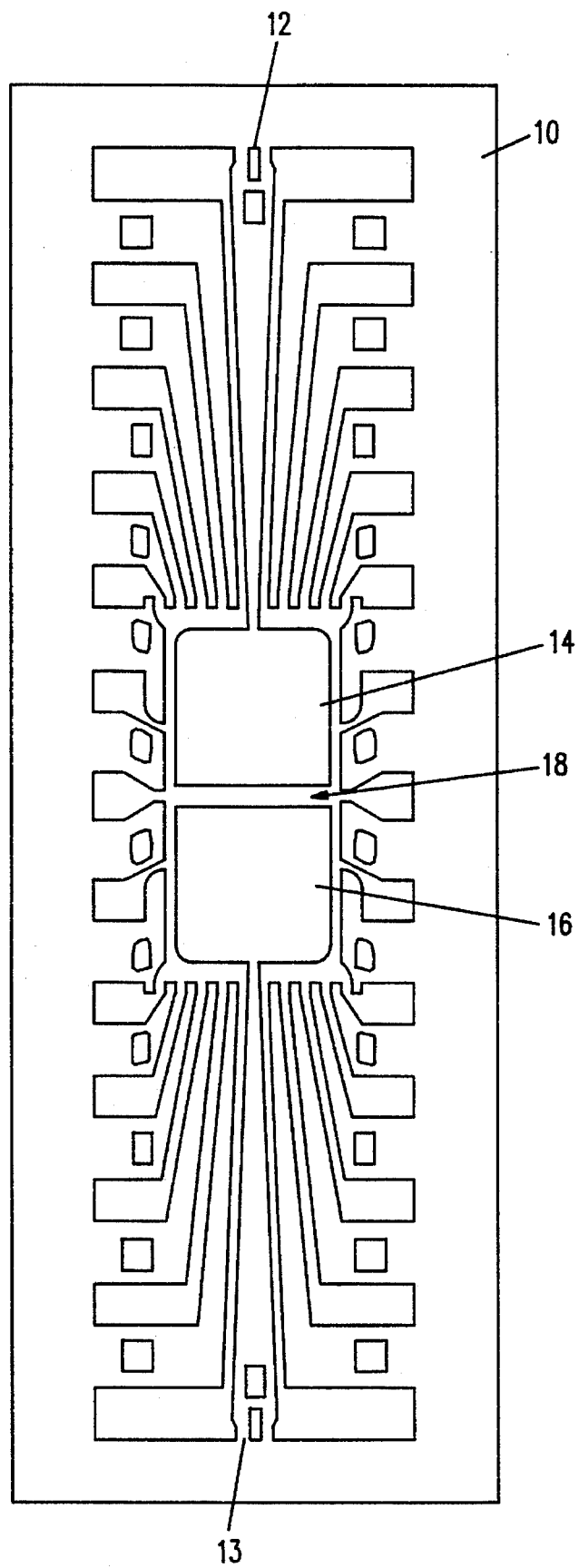
FIG. 1b is a diagrammatic view of a prior art small form factor package lead frame for isolated circuits with center mounted tie bars.
Figure 2:
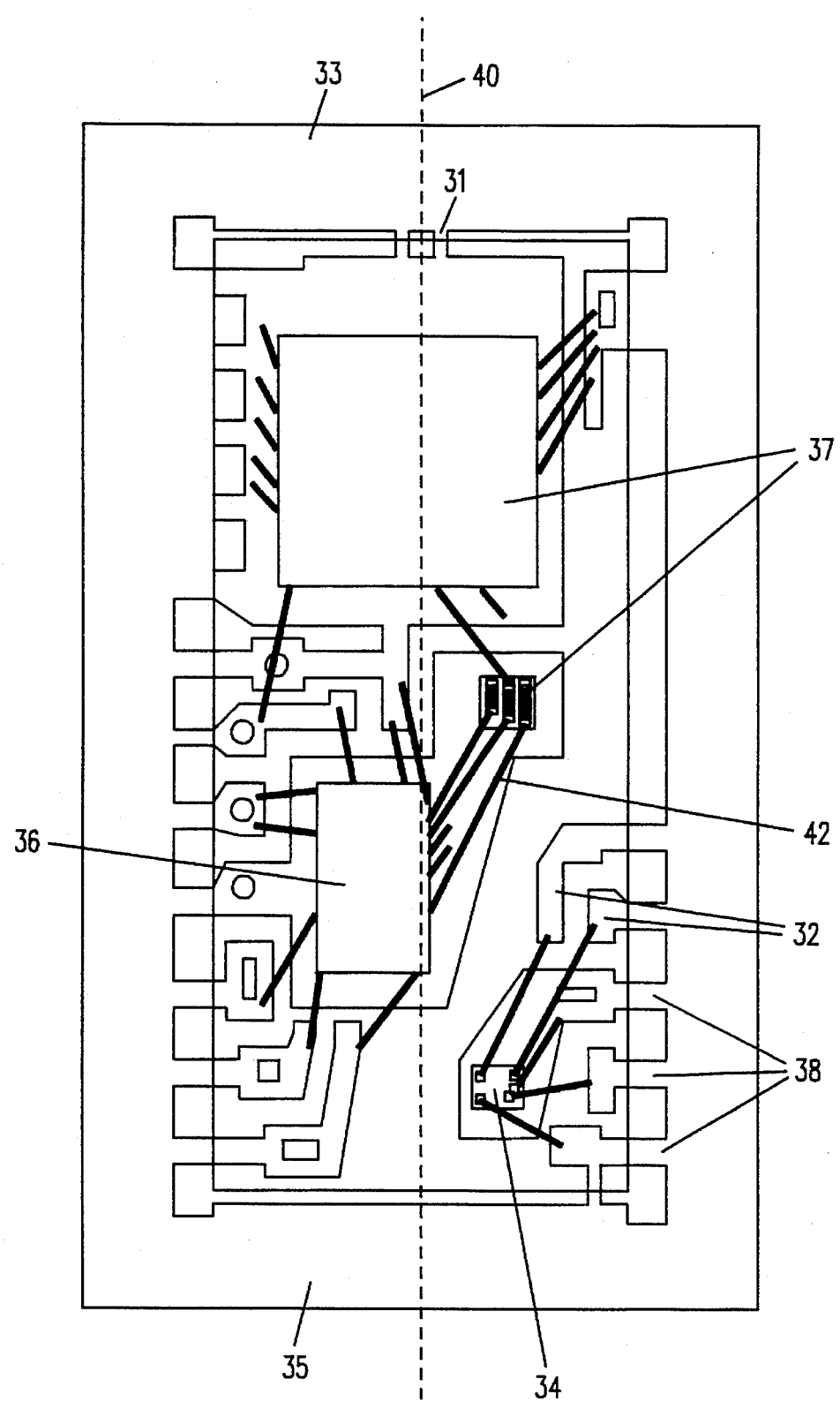
FIG. 2 is a diagrammatic view of the internal package structure of a tie bar mounted off-center to the longitudinal center line.

Referring initially to FIG. 2, a lead frame structure in accordance with the present invention will be described. In the embodiment of FIG. 2 shown where areas of a conductive sheet used for making lead frames are punched out, the internal components of a power supply are arranged in two isolated circuits (i.e. primary and secondary circuits). At the stage shown, the lead frame 30 has been stamped for assembly and the components of the primary and secondary circuits have been mounted thereon. At this point, the lead frame includes a plurality of leads 32, tie bars 31 and 34 and handling side rails 35 and 33. Tie bars 31 are positioned near the frame's longitudinal center line 40 on a first end of the lead frame and connect the lead frame to a first rail 33. In the embodiment shown, tie bars 31 are connected to the primary circuit. Tie bar 34 is connected off-center to a second end of the lead frame and is arranged to connect the lead frame to a second handling side rail 35. The lead frame, the handling rails and the tie bar are generally all formed from a single sheet of conductive material.

The lead frame 30 may be constructed from any suitable electrically conductive material. By way of example, lead frames typically are formed from copper or a copper alloy. This is because copper has relatively good conductivity and is cost effective. There are several techniques by which a lead frame may be formed, including stamping and etching. Typically, stamping is a preferred method for mass production since substantially identical elements can be turned out very quickly. Etching based approaches, such as chemical etching, precision laser etching and the like, may also be used and are particularly desirable for smaller lot production.

The electronic components 37 that constitute the primary circuit 36 and the secondary circuit 38 are mounted on and electrically coupled to the lead frame. The components are coupled to associated traces or leads 32 of the lead frame in any suitable conventional manner. Thus, the various circuit components are in electrical communication with one another and external circuit components. The attaching and electrical connecting steps may be accomplished in any suitable manner. By way of example, in high production system, attaching components to the lead frame is typically done by assembly robots that can pick and place components very quickly while traveling down an assembly line. One method of electrically coupling the components, for example, is by using bonding wires 42 attached by a wire bonder through a technique well known in the industry. Bond wires 42 are made of a conductive material such as gold because of its excellent conductivity and ability to bond well to the silver spot plating on the die bond pads. The other end of the bond wire is attached to leads 32 which extend away from the associated primary or secondary circuits to form external pins. Bond wires also are used to interconnect other related components such as A/D converters and jumpers associated with the primary or secondary circuits, for example.

By way of example, the embodiment shown in FIG. 2 has a jumper and three dies: a primary circuit die, a secondary circuit die, and a controller die which are interconnected by bonding wires. The primary circuit includes a primary controller and a switching Field Effect Transistor (FET). The secondary circuit includes a controller and a circuit to provide a DC voltage to the primary controller. The controller and jumper are interconnected to the primary circuit and connected to related primary pins through bonding wires. It should be noted that the invention is not limited to wire bonding and other methods of electrically coupling the components are also possible.

After the various components have been attached and electrically connected, a molding step is performed that encapsulates the components and inner portion of the lead frame to form a exterior protective package (not shown) that is well known in the art. This provides the impermeable outer package to protect the delicate electronic components from the environment. By way of example, a popular encapsulating material is plastic since it is relatively inexpensive and can be readily applied through transfer molding techniques that are well known in the art. Alternative materials such as ceramic or other suitable encapsulating materials used in the industry may also be used.

Using a plastic overmolding process as an example, the overmolding is conducted such that the handling rails 35 and 33 are located outside of the package molding and are connected to the tie bars 31 and 34 to support and align the lead frame assembly during the manufacturing process. After the molding material is set, a trimming step is performed which, among other things, cuts the tie bars 31 and 34 at the molding edge to remove the rails 35 and 33, leaving the cut ends of the tie bars exposed through the molding. The resulting package thus has an exposed tie bar 34 that is located off-center a specified distance from the longitudinal center line 40 of the package. This approach may be use to obtain additional space between the exposed external surfaces of the primary and secondary circuits.

To meet UL safety requirements, internal components in the primary circuit must be laid out such that they are spaced a minimum of a designated distance apart from the nearest secondary circuit. The actual separation distances required vary somewhat in accordance with the voltage involved.

Therefore, during the lead frame layout design stage, the required separation distances must be kept in mind. By way of example, in a 120 V AC to 5 V DC step down voltage converter, internal component spacing minimums of 0.4 mm (15.75 mils) are required by the UL-1950 specification. Similarly, the external components must be spaced an even greater distance apart. By way of example, the UL-1950 specification for the minimum space between external surfaces for isolated circuits is 6.4 mm (252 mils).

After the package has been molded and trimmed, the cut-off end of the tie bar is exposed through the edge of the molding. Since the end of the tie bar 34 is exposed and it is attached to one of the internal circuits (the secondary circuit in the present embodiment), it must be treated as an external surface and must conform to the spacing requirements. To minimize product equipment and retooling cost for new packages, it is desirable to permit such isolated circuits to be packaged in standard small form factor packages, such as those under 7.62 mm (300 mils) in width. As indicated above, in the embodiment shown, the minimum distance for internal components between primary and secondary circuit is 0.4 mm (15.75 mils). Since a number of pins proximate to tie bar 34 are connected to the primary circuit, the external requirement can not be easily met with a center positioned tie bar. Therefore, in the embodiment shown, the off-center tie bar is connected to the secondary circuit via the inner finger (corner pin). This places additional distance between the tie bar and the closest primary pin.

Using this arrangement, the present invention has advantages of qualifying for UL approval while realizing dramatic savings by avoiding production retooling expenses. The standard assembly process for DIP and SO packages is not altered since these small form factor packages are previously used by existing products thus imposing no additional setup costs. Savings are also realized in the testing phase since the same test equipment can be used. Another advantage is the packages continue to use standard handling side rails thus imposing no cost increase for using nonstandard rails.

The previous discussion is directed to a first embodiment where only one off-center tie bar, connected to the secondary circuit, was required to meet the UL specification. The other tie bar at the opposite end of the lead frame is mounted to a primary structure along the centerline of the package because the pins at that end of the package are all related to primary circuit components. In alternative embodiments, the tie bars could be mounted off-center at each end of the lead frame and may be connected to either the primary or secondary circuits. By way of example, this may be advantageous if the package includes a third isolated circuit where similar external distance requirements are necessary between the isolated circuits. The location of the external pins and their proximity to pins of differing circuits determines which or both of the tie bars should be placed off-center. Although only one embodiment of the present invention showing a small form factor lead frame has been described in detail, it should be understood that the present invention may embody other forms, such as lead frames for Quad Flat Pack packages, without departing from the spirit or scope of the invention. Particularly, the described device may be constructed using a plurality of tie bars and rails connected to the lead frame through either the primary or secondary circuits. Additionally, other techniques of fastening the tie bars to the supporting structures are also covered by the scope of the preceding description. However, the actual construction may vary somewhat therefore the present examples are to considered as illustrative and not restrictive and the invention is not to be limited to the details given herein, but may be modified within the scope of the appended claims.

What is claimed is:

1. A dual in-line type package comprising:
   (a) a primary circuit and a secondary circuit isolated from the primary circuit;
   (b) a lead frame assembly having a plurality of leads, a first end of each lead being electrically coupled to an associated circuit component in an associated one of the primary and secondary circuits;
   (c) an encapsulating material molded over the circuit components and an inner portion of the lead frame to form an exterior protective package, the exterior protective package having opposing first and second sides, opposing first and second ends, and a longitudinal center line between the first and second sides, wherein the leads have exterior pin portions that extends outside of the protective package along the first and second sides of the protective package, there being a first side end pin portion that defines the pin portion extending from the first side of the protective package that is closest to the first end of the protective package and there being a second side end pin portion that defines the pin portion extending from the second side of the protective package that is closest to the first end of the protective package, the first side end pin portion being associated with the primary circuit and the second side end pin portion being associated with the secondary circuit; and
   (d) a tie bar connected to a portion of the lead frame that is associated with the secondary circuit, the tie bar being exposed on the first end of the exterior protective package and being positioned off-center relative to the longitudinal center line of the package such that the distance between the tie bar and the first side end pin portion is greater than one half the width of the package;
   wherein the tie bar is arranged for connecting to a side rail external to the package to support the lead frame during manufacturing.

2. A dual in-line type package as recited in claim 1 having a package width of less than 7.62 mm (300 mils).

3. A dual in-line type package as recited in claim 1 wherein the package is a dual in-line (DIP) package for through hole or plug-in socket applications.

4. A dual in-line type package as recited in claim 1 wherein the package is a small outline (SO) package for surface mount applications.

5. A dual in-line package as recited in claim 1 wherein the components are electrically coupled by bonding wires.

6. A dual in-line type package as recited in claim 1 wherein the encapsulating material is a injection molded plastic.

7. A dual in-line type package as recited in claim 1 wherein the tie bar is connected to a portion of the lead frame that is associated with the primary circuit.

8. An electronic package for isolated power supply circuits, comprising:
   (a) a primary circuit having associated internal primary circuit components and a secondary circuit having associated internal secondary circuit components, said primary and secondary circuits being isolated from each other;
   (b) a lead frame having a plurality of leads, a first end of each lead being electrically coupled to a respective one of the associated internal primary and secondary circuit components;

(c) an encapsulating material molded over the circuit components and an inner portion of the lead frame to form an exterior protective package having a width, wherein portions of the leads extend externally from the exterior protective package to form external pins having first and second end pins, the exterior protective package having opposing first and second sides, opposing first and second ends, and a longitudinal center line that is parallel to the first and second sides, the first end pin being the external pin along the first side that is closest to the first end and the second end pin being the external pin along the second side that is closest to the first end, wherein the first end pin is associated with the primary circuit and the second end pin is associated with the secondary circuit;

wherein the internal portions of the primary and secondary circuits are spaced apart at least a minimum of a first predetermined distance;

wherein the external pins of the primary and secondary circuits are spaced apart at least a minimum of a second predetermined distance that is greater than half the width of the exterior protective package; and (d) a tie bar connected to the lead frame, and being exposed on the first end of the exterior protective package, the tie bar being positioned off-center relative to the longitudinal center line of the package such that the distance between the tie bar and a selective one of the end pins is greater than one half the width of the package;

wherein the tie bar is connected to a lead associated with a first one of the primary and secondary circuit components, and the tie bar is spaced apart from the external pins of a second one of the primary and secondary circuit components by at least a minimum of the second predetermined distance.

9. An electronic package as recited in claim 8 wherein the first predetermined distance is 0.4 mm (15.75 mils).

10. An electronic package as recited in claim 8 wherein the second predetermined distance is 6.4 mm (252 mils).

11. An electronic package as recited in claim 8 wherein the tie bar is connected to the secondary circuit.

12. An electronic package as recited in claim 8 wherein the components are electrically coupled by bonding wires.

13. An electronic package as recited in claim 8 wherein the encapsulating material is an injected molded plastic.

14. An electronic package as recited in claim 8 wherein the tie bar is connected to the primary circuit.

15. An electronic package for isolated power supply circuits, comprising:

(a) a primary circuit and a secondary circuit isolated from the primary circuit;

(b) a lead frame assembly having a plurality of leads, a first end of each lead being electrically coupled to an associated circuit component in an associated one of the primary and secondary circuits;

(c) an encapsulating material molded over the circuit components and part of the lead frame to form an exterior protective package the exterior protective package having opposing first and second sides, opposing first and second ends, and a longitudinal center line between the first and second sides, wherein the leads have exterior pin portions that extends outside of the protective package along the first and second sides of the protective package, there being a first side end pin portion that defines the pin portion extending from the first side of the protective package that is closest to the first end of the protective package and there being a second side end pin portion that defines the pin portion extending from the second side of the protective package that is closest to the first end of the protective package, the first side end pin portion being associated with the primary circuit and the second side end pin portion being associated with the secondary circuit; and (d) a tie bar having first and second ends, the first end of the tie bar being connected to the lead frame, the second end of the tie bar being exposed through and aligned with the first end of the exterior protective package, the tie bar being positioned off-center relative to the longitudinal centerline of the package;

wherein the tie bar is arranged for connecting to a side rail external to the package to support the lead frame during manufacturing.

16. An electronic package as recited in claim 15 wherein the tie bar is connected to one of the primary and secondary circuit structures.

17. An electronic package as recited in claim 15 wherein the components are electrically coupled by bond wires.

18. An electronic package as recited in claim 15 wherein the encapsulating material is an injected molded plastic.

* * * * *